United States Patent
Dyachenko et al.

(10) Patent No.: US 10,868,555 B2
(45) Date of Patent: Dec. 15, 2020

(54) SUCCESSIVE APPROXIMATION REGISTER (SAR) ANALOG-TO-DIGITAL CONVERTER (ADC), RADAR UNIT AND METHOD FOR IMPROVING HARMONIC DISTORTION PERFORMANCE

(71) Applicant: NXP B.V., Eindhoven (NL)

(72) Inventors: Vladislav Dyachenko, Eindhoven (NL); Erwin Janssen, Veldhoven (NL); Yu Lin, Utrecht (NL); Athon Zanikopoulos, Riethoven (NL)

(73) Assignee: NXP B.V., Eindhoven (NL)

( * ) Notice: Subject to any disclaimer, the term of this patent is extended or adjusted under 35 U.S.C. 154(b) by 182 days.

(21) Appl. No.: 16/145,741

(22) Filed: Sep. 28, 2018

(65) Prior Publication Data

US 2019/0173479 A1 Jun. 6, 2019

(30) Foreign Application Priority Data

Dec. 5, 2017 (EP) .................................. 17205353

(51) Int. Cl.
*H03M 1/06* (2006.01)
*G01S 7/35* (2006.01)
*H03M 1/46* (2006.01)

(52) U.S. Cl.
CPC .......... *H03M 1/0641* (2013.01); *G01S 7/352* (2013.01); *H03M 1/0612* (2013.01); *H03M 1/46* (2013.01)

(58) Field of Classification Search
CPC .... H03M 1/0641; H03M 1/0612; H03M 1/46; H03M 1/462; H03M 1/468; H03M 1/0614; G01S 7/352

USPC .................................... 341/131, 163, 172
See application file for complete search history.

(56) References Cited

U.S. PATENT DOCUMENTS

| 4,550,309 A | 10/1985 | Hiller et al. |
| 7,286,075 B2 * | 10/2007 | Hennessy ........... H03M 1/0639 341/144 |
| 7,663,518 B2 * | 2/2010 | Hurrell ............... H03M 1/0641 341/131 |

(Continued)

OTHER PUBLICATIONS

Glascott-Jones, A., "Dither Can Boost Sampled Data System Performance by at Least 10 dB", Electronic Design, Technologies, Analog, e2v, Jan. 25, 2013 (downloaded Aug. 14, 2018).

(Continued)

*Primary Examiner* — Khai M Nguyen

(57) ABSTRACT

A successive approximation register, SAR, analog-to-digital converter, ADC, (400) is described. The SAR ADC (400) includes: a track and hold circuit (414) configured to sample an analog input signal (410); a comparator (416) coupled to the track and hold circuit and configured to compare the sampled analog input signal (410) with a DAC (444) output voltage; and a feedback path (422) that comprises a digital-to-analog converter, DAC, (444) configured to generate the reference voltage that approximates the input analog signal (410). The SAR ADC (400) further includes a dither circuit (468) coupled to or located in the feedback path (422) and arranged to add a dither signal at an input of the DAC (444) in a first time period and subtract the dither signal from the output digital signal routed via the feedback path (422) and input of the DAC (444) in a second time period during a conversion phase of the SAR ADC (400).

20 Claims, 7 Drawing Sheets

(56) References Cited

U.S. PATENT DOCUMENTS

| | | | |
|---|---|---|---|
| 8,319,673 B2* | 11/2012 | Steensgaard-Madsen | ............... H03M 1/18 341/118 |
| 8,655,653 B2 | 2/2014 | Vos | |
| 8,766,836 B2 | 7/2014 | Maurino et al. | |
| 10,382,048 B2* | 8/2019 | Fernando | ............. H03M 1/201 |

OTHER PUBLICATIONS

Wannamaker, R., "Subtractive and Nonsubtractive Dithering: A Mathematical Comparison", J. Audio Eng. Soc., vol. 52, No. 12, Dec. 2004.

Xu, R., "Digitally Calibrated 768-kS/s 10-b Minimum-Size SAR ADC Array With Dithering", IEEE Journal of Solid-State Circuits, vol. 47, No. 9, Sep. 2012.

Zhang, S., "A 11-Bit 1.2V 40.3µW SAR ADC With Self-Dithering Technique", IEEE 2016.

* cited by examiner

SUCCESSIVE APPROXIMATION REGISTER (SAR) ANALOG-TO-DIGITAL CONVERTER (ADC), RADAR UNIT AND METHOD FOR IMPROVING HARMONIC DISTORTION PERFORMANCE

CROSS-REFERENCE TO RELATED APPLICATIONS

This application claims the priority under 35 U.S.C. § 119 of European Patent application no. 17205353.0, filed on 5 Dec. 2017, the contents of which are incorporated by reference herein.

FIELD OF THE INVENTION

The field of the invention relates to a successive approximation register (SAR) analog-to-digital converter (ADC), a radar unit and method for improving a harmonic distortion performance thereof. The invention is applicable to various SAR ADC topologies.

BACKGROUND OF THE INVENTION

In a radar system, it is known that the signal level of received signals may vary across a large dynamic range. In order to avoid false alarms and missing detection, an extraordinarily linear receiver is required in order to reliably detect weak reflection signals that are received barely above the noise floor (e.g. from targets with a small cross section and/or that are relatively far away such that the echo signal is returned at a very low level). A problem exists when these weak reflection signals coexist with other strong reflection signals (e.g. from nearby pedestrians mixed with nearby vehicles, say in an urban area).

When receiving strong echo/reflection signals, the radar receiver channel linearity is normally limited by the non-linearity of millimetre (mm) Wave/radio frequency (RF) front-end circuits of the radar unit; whilst for weak reflection signals it is limited by the analog-to-digital converters' (ADC's) performance at being able to identify a small received signal (say from a distal object) from amongst one or more much larger received signals. The ADCs for high performance automotive radar sensors (sometimes referred to as radar units) are required to have ultra-low spur levels (e.g. below −90 dBFS or even −100 dBFS) together with a wide bandwidth, low noise, low power and low latency under wide operation conditions. Designing such an ADC in order to meet such stringent small signal linearity requirements is a challenging task.

In contrast to linear amplifiers, harmonic distortions introduced by the static linearity errors (differential nonlinearity (DNL)/integral nonlinearity (INL)) of Nyquist-rate ADCs do not scale down when input signal amplitude decreases; instead it is recognised that they can stay at a similar level, noting that DNL is the differential nonlinearity and is defined by the deviation between the difference between an actual step width and the ideal value of '1' least significant bit (LSB), whilst INL is the integral nonlinearity and is defined by the deviation of the actual ADC transfer function from the ideal one.

The successive approximation register (SAR) ADC architecture is one of the most popular ADC architectures, as demonstrated in many publications, for achieving a good overall performance (e.g. wide bandwidth, low power, low latency). However, the small input signal linearity of the SAR ADC is limited. FIG. 1 illustrates a known generic block diagram of a SAR ADC 100 without a dither circuit, and the operational phases and waveforms 150 of a SAR ADC. The SAR ADC 100 includes an input 110, which is connected to a track and hold (T/H) circuit 112. The output of the T/H circuit 112 is input to a summation point 114, whose output is provided to a comparator 116 and finally a SAR controller 118. A feedback path connects the SAR controller 118 to the summation point 114 via a digital-to-analog converter (DAC) 120 with a reference voltage 124. The final digital word appears at the SAR ADC output 122.

A conversion step of an SAR ADC 100 is shown in the operational phases and waveforms 150, which illustrates signal amplitude 152 versus time 154. It consists of two phases; tracking phase 160 and conversion phase 170. At the end of a tracking phase 160, an analog signal is sampled by the T/H circuit 112 and the DAC 120 output is set to an initial voltage. In general, the conversion phase 170 consists of N conversion periods, where N is number of SAR ADC bits, wherein a DAC output voltage is subtracted from the sampled signal at summation point 114. The comparator 116 determines a sign after the subtraction operation, and, based on the sign, the SAR controller 118 sets a most significant bit (MSB) at the ADC output 122. Furthermore, the SAR controller 118 controls the DAC 120 in a way that ½ of the reference voltage is added or subtracted from the previous DAC value. The next step resolves MSB-1, MSB-2, etc., by changing the output of the DAC 120 accordingly by a ¼Vref, ⅛ Vref, etc., and adding or subtracting a new DAC value from the sampled input at summing junction 114. At the end of the conversion phase, the DAC output ($V_{DAC}$) 180 approximates the sampled signal ($V_{sample}$) 190 with a maximum deviation of $V_{LSB}/2$, ideally. The output digital codes ($D_{out}$) represent the sampled analog signal.

The DAC output in FIG. 1 generates fractions of the reference voltages (¼ Vref, ⅛ Vref, etc.,) with a help of passive or active components. Due to practical limitations of technologies, all electronic components have random and systematic fluctuations, which cause the DAC sources (i.e. weights) and reference voltages to deviate from the perfect values. Supply ripples due to non-zero output impedance of a power supply and ground-bouncing introduce even more errors in the generated reference levels. Further, a reference voltage generator itself has a limited accuracy. As a result, INL/DNL errors appear.

Moreover, at small input amplitudes higher order harmonic distortion (HD) levels appear, since only a few LSBs of the ADC are switching, thereby creating a large quantization error that is correlated with the input signal. The smaller the signal at the ADC input, the more severe effect of static linearity errors (i.e. INL/DNL) on dynamic performance, as identified in the application note 'AN-804 Improving A/D Converter Performance Using Dither', as found at www.ti.com.cn/cn/lit/an/snoa232/snoa232.pdf.

FIG. 2 illustrates a known generic block diagram of a SAR ADC 200 with a dither circuit 260. Again, the SAR ADC 200 includes an input 210, which is connected to a track and hold (T/H) circuit 212. The output of the T/H circuit 212 is input to a summation point 214, whose output is provided to a comparator 216 and finally a SAR controller 218. A feedback path connects the SAR controller 218 to the summation point 214 via a DAC 220 with a reference 224. The final digital word appears at the ADC output 222. As illustrated, this SAR ADC 200 includes a dither circuit 260 that is connected to an output summation point 270 and a feedback summation point 250 located after the DAC 220.

It is known that using dithering and subtractive dithering techniques may improve Spurious Free Dynamic Range (SFDR) for small and mid-range input signals, which may address one or more of the above-mentioned problems. In the SAR ADC 200 of FIG. 2, a random value is added by a dither circuit 260 at additional summation point 250 at the beginning of the conversion phase. When the conversion phase is finished, the same value is subtracted from the final output at output summation point 270. This adds extra overhead in the digital domain. Moreover, since the dither element is basically a DAC, a difference between the analog output of this DAC and its digital representation adds extra noise after subtraction, thereby degrading the overall signal to noise ratio (SNR) performance of the SAR ADC 200.

Thus, the inventors have identified and appreciated that DAC is not able to generate perfect reference voltage necessary for analog to digital conversion, leading to unwanted harmonic distortion and spurs, and, consequently, limits the linearity of the ADC.

Thus, a mechanism is needed to improve SAR ADC performance, for example within a radar unit.

SUMMARY OF THE INVENTION

The present invention provides a successive approximation register (SAR) analog-to-digital converter (ADC) with a subtractive dither circuit for improving a linearity performance thereof, as described in the accompanying claims. Specific embodiments of the invention are set forth in the dependent claims. These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Because the illustrated embodiments of the present invention may, for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

Differential nonlinearity (DNL)/integral nonlinearity (INL) errors due to mismatch of DAC cells in a SAR ADC are the main source of harmonic spurs for converting small signals. So far, known methods have been exploited to improve matching, e.g. by using larger size components or calibration. However, since component size is always limited by dimension constraints, and calibration techniques inherently exhibit a limited accuracy, some DNL errors will inevitably remain, and therefore degrade the ADC linearity.

The inventors of the present invention have recognized and appreciated that it would be advantageous to develop a SAR ADC design, for example for a radar unit, with an ultra-low spur level for small and mid-range signals. In order to decrease harmonic distortions of SAR ADCs due to INL/DNL errors at moderate and weak input signals, a novel subtracting dither technique is proposed. In accordance with example embodiments of the invention, the dither is added preferably during a sampling phase of the ADC and subtracted during the conversion step, after a number of MSB decisions but notably before the conversion phase is completed. Added dither randomizes the DAC decisions and consequently brakes any dependency between the quantization error and the input signal level, improving overall linearity of the ADC. In the proposed design, a dither subtraction is included as a built-in operation of the DAC, which does not require any 'knowledge' about the dither DAC in the digital domain and does not require any post-processing in the digital domain. Moreover, it is possible to implement this function with no extra circuitry required in the analog domain.

Therefore, examples of the invention describe a SAR ADC scheme with a mechanism that introduces a dither signal within a SAR ADC feedback loop. Furthermore, in some examples, a subsequent subtraction of the dither signal may be employed after a number of (say, a few, of the order of 3-5 in some examples) MSB DAC cell outputs. In this manner, the SAR ADC examples are designed to be considerably less insensitive to mismatches of DAC cells in improving signal linearity. Besides that, the proposed SAR ADC provides an additional benefit of randomizing error appearing due to various imperfections in a circuit, e.g. finite settling time, memory effects, etc.

Figure 1:
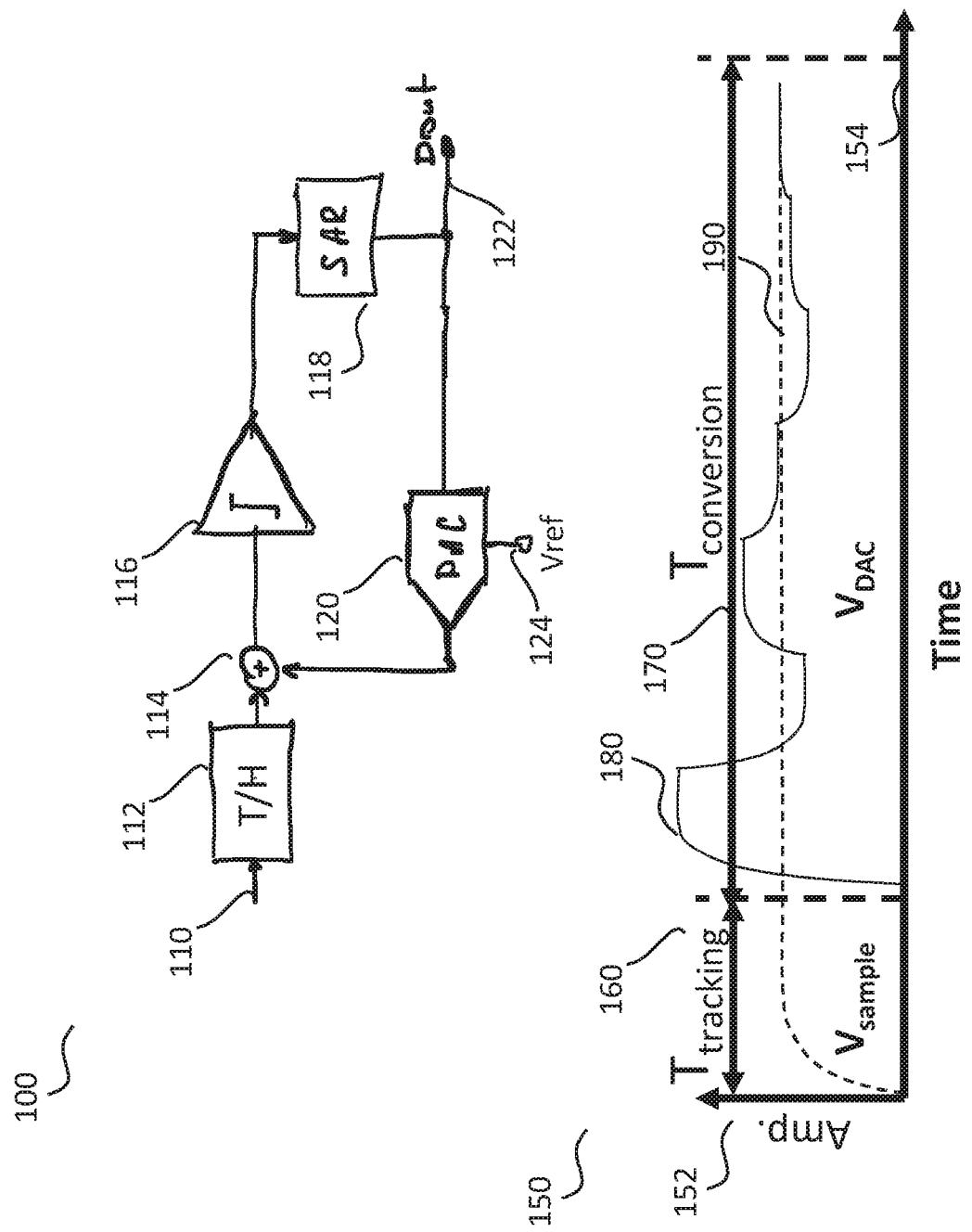
FIG. 1 illustrates a known generic block diagram of a SAR ADC without a dither circuit, as well as the operational phases and waveforms of a SAR ADC.
Figure 2:
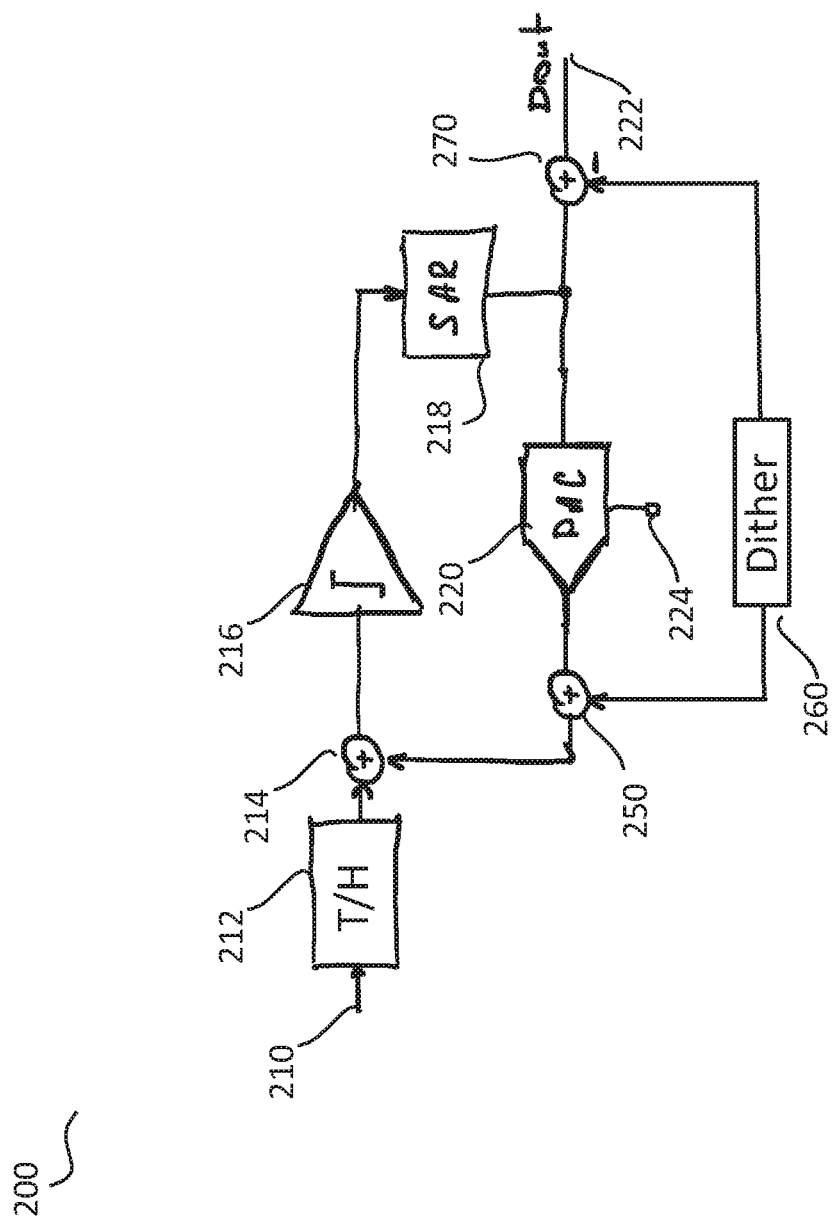
FIG. 2 illustrates a known generic block diagram of a SAR ADC with a dither circuit.
Figure 3:
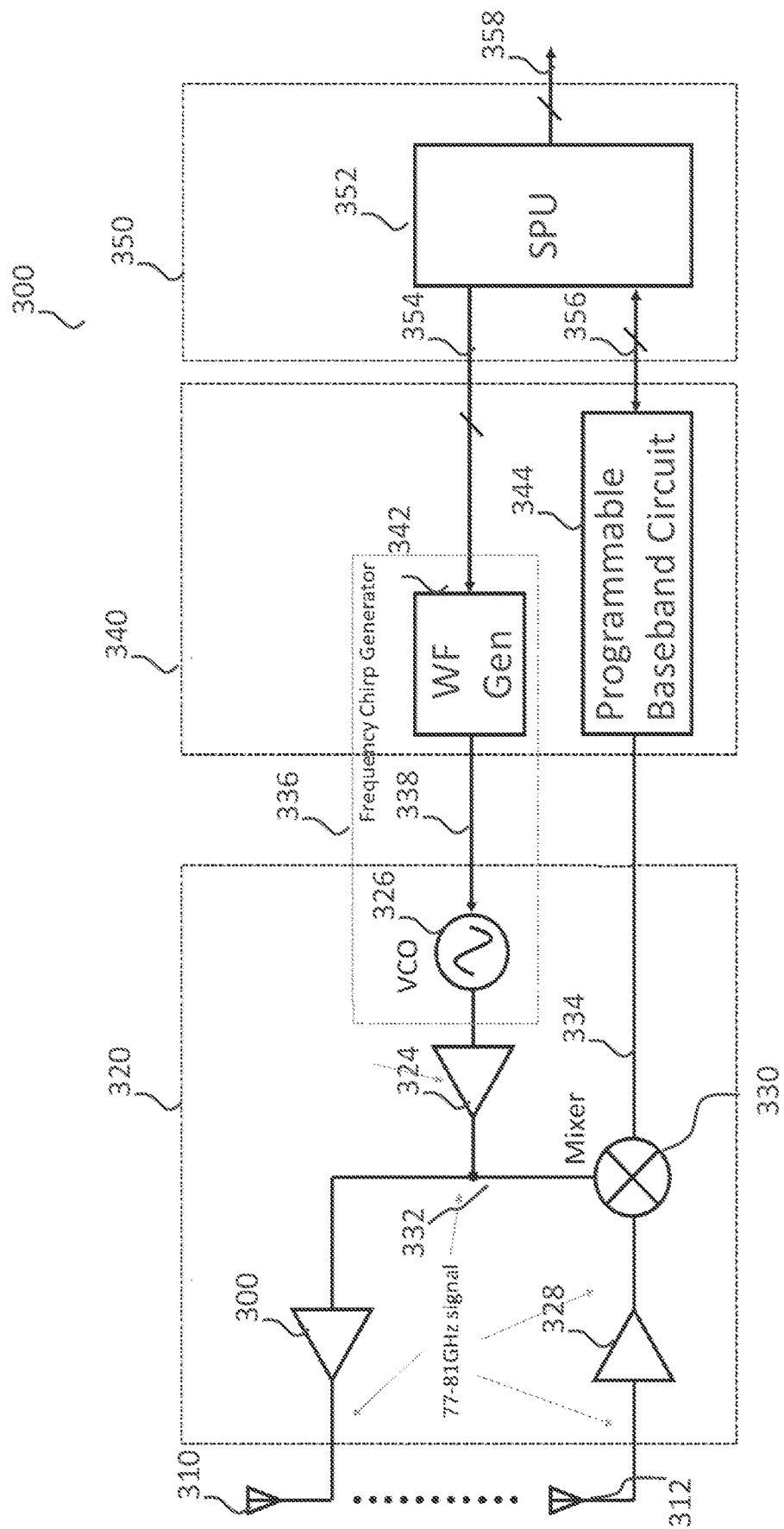
FIG. 3 illustrates an example block diagram of a radar unit, adapted according to example embodiments of the invention.

Referring now to FIG. 3, a block diagram illustrates a frequency modulated continuous wave (FMCW) radar unit 300, adapted according to examples of the invention. The FMCW radar unit 300 includes one or more transmitter antenna(e) 310 and one or more receiver antenna(e) 312 and transceiver and signal processing circuits. The radar functions with multiple separate ICs include, e.g., a mmW transceiver (TxRx) circuit 320, an analog/mixed signal baseband circuit 340 and a microprocessor IC 350. In a transmitter sense, the microprocessor IC 350 includes a digital control and signal processing unit 352 that provides a transmit radar signal 354 to a frequency chirp generator circuit that includes a waveform generator 342 in the analog/mixed signal baseband circuit 340. The waveform generator 342 provides a signal 338 that is to be modulated to a voltage controlled oscillator (VCO) circuit 326. The modulated signal is then optionally passed to a frequency multiplier 324 (if the VCO generated signal is not at the operating frequency of the FMCW radar unit 300). The high-frequency output 332 of the VCO 326 or the frequency multiplier 324 is passed to a power amplifier 322, where it is amplified and routed to the one or more transmitter antenna(e) 310.

A radar signal is received at the one or more receiver antenna(e) 312 and passed to a low noise amplifier (LNA) 328 where it is amplified. The amplified received radar signal is passed to a down-mixer 330, where it is mixed with the high-frequency signal 332 output from the VCO 326. The down-converted received radar signal 334 from down-mixer 330 is input to a programmable baseband circuit 344 that includes a bandpass filter and one or more gain amplifiers, as well as an SAR ADC adapted according to examples of the invention. The improved SAR ADC is illustrated in, and described with reference to, subsequent figures. The digital output 356 from the programmable baseband circuit 344 is input to the digital control and signal processing unit 352 for processing and the received processed radar signal 358 is output.

Figure 4:
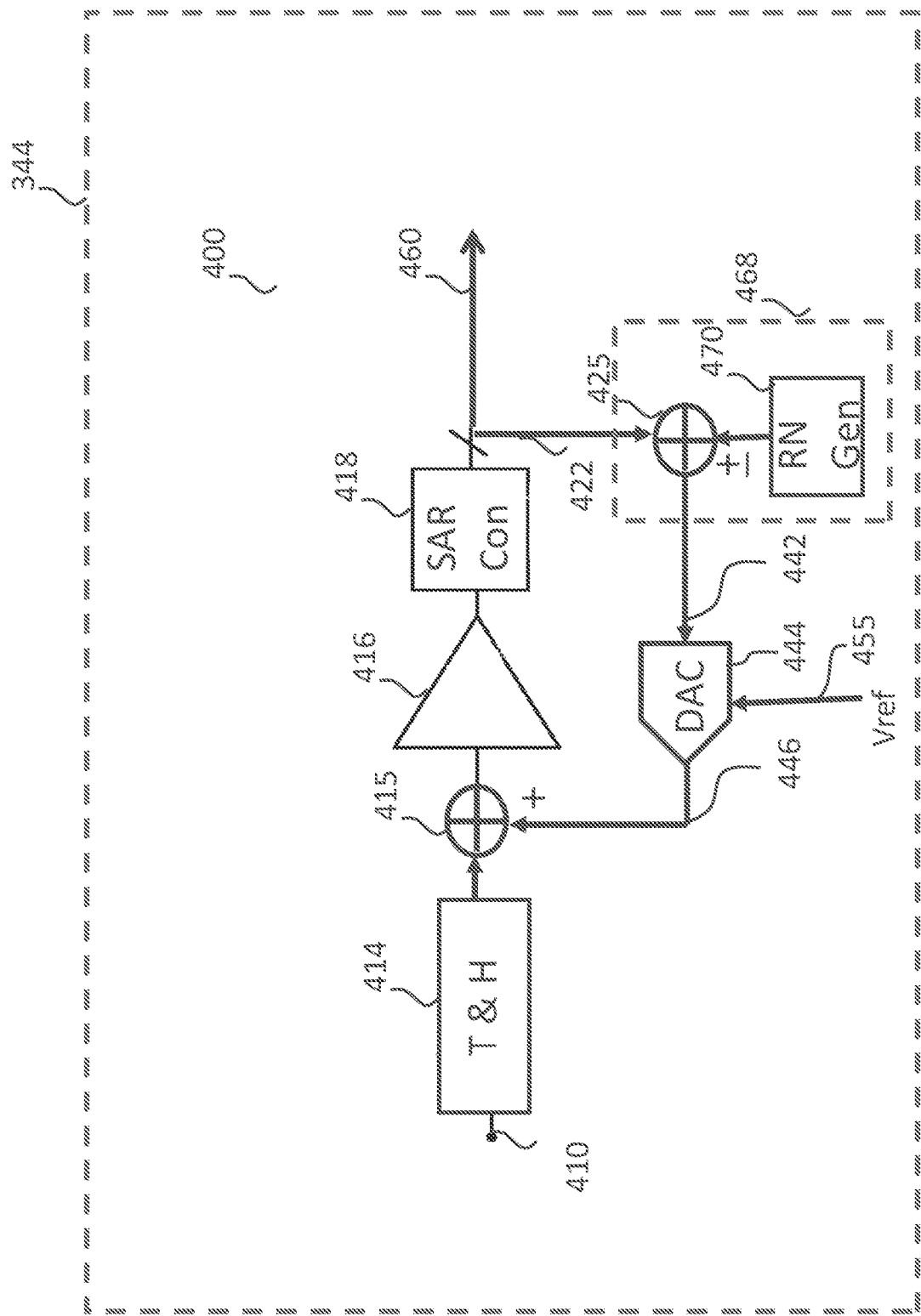
FIG. 4 illustrates an example block diagram of a SAR ADC, for example implemented in the radar unit of FIG. 3, according to example embodiments of the invention.

Referring now to FIG. 4, an example block diagram of a SAR ADC 400, for example implemented in the programmable baseband circuit 344 of radar unit 300 of FIG. 3, is illustrated according to example embodiments of the invention. The SAR ADC 400 includes an input 410 that is provided to a track-and-hold (T/H) (or sometimes referred to as a sample-and-hold (S/H)) circuit 414, which comprises a switch. In some examples, DAC 444 may be a current-steering DAC or switched-capacitor-based DAC or resistor-based ADC. It is envisaged that in other examples, other ADC architectures and circuit arrangements may be used. Thereafter, a comparator circuit 416 is configured to determine a sign of the subtraction operation between a sampled signal at the T/H output and the DAC output. The output from the comparator circuit 416 is input to SAR logic 418, for example in a form of a SAR controller. A feedback path 422 from the SAR controller includes DAC 444 that is configured to generate reference voltages, which are subtracted from the sampled signal in summing junction 425 during each conversion period. The output of the SAR controller is a digital output signal 460.

The DAC 444 inside the SAR ADC is controlled by a SAR controller (i.e. SAR logic 418) in order to generate an analog reference voltage derived from the external reference $V_{ref}$ 455 during conversion phase. The DAC can be constructed using weighted current cells, resistor ladder or switched capacitive type circuits, as known.

In this example, SAR ADC 400 includes a new dithering circuit 468, located inside of the SAR ADC 400 in the feedback path 422 and at an input of the DAC 444. In some examples, the dithering circuit 468 includes a random number generator circuit 470 that generates a random number that is subtracted from the digital output of the SAR controller in summing junction 425. The output of summing junction 425 is then input to DAC 444. In examples of the invention, a conversion operation starts as the input signal 410 is sampled by the T/H circuit 414. At the same time, a dither signal is generated by the random number generator 470 and sets an initial (reset) voltage at the DAC output. In some alternative examples, the feedback path may include a DAC 444 and an extra dither DAC arranged to convert a digital dither signal to an analog form to add to the DAC 444 output, where the added value is known.

During the conversion phase, for example after a number of MSB decisions have been made, the previously added dither value is applied to the DAC input again but with opposite polarity, thereby subtracting the same dither value that had previously been added during a sampling phase. Dither can be subtracted after the 1$^{st}$ MSB decision. However, in this case, only errors introduced by MSB current source will be dithered. In some examples, increasing the number of bits (prior to subtracting the dither value) allows to randomize errors caused by these bits. However, the subtraction must happen while there is still an over-range that is bigger than the dither value. In summary, a maximum number of bits is defined by particular implementation and is determined by an over-range of the DAC, and a minimum number of decision bits (prior to the dither value being added) is '1'.

Effectively, this addition of a random value during a sampling phase and thereafter making a few conversions with the introduced random number (from the random number generator 470), randomizes a complete decision tree and, therefore, possible DNL errors introduced by imperfection of the DAC weights, settling and memory errors. Although examples of the invention describe a technique whereby the dither signal (value from a random number generator) is added during a sampling phase, it is envisaged that, in other examples, the dither signal may be added just prior to or just subsequent to the sampling phase, e.g. at the beginning of the conversion phase.

Advantageously, the addition and subtraction of a random number does not need to be closely controlled, since any imperfection in the subtraction operation adds only noise and not harmonic distortions.

Figure 5:
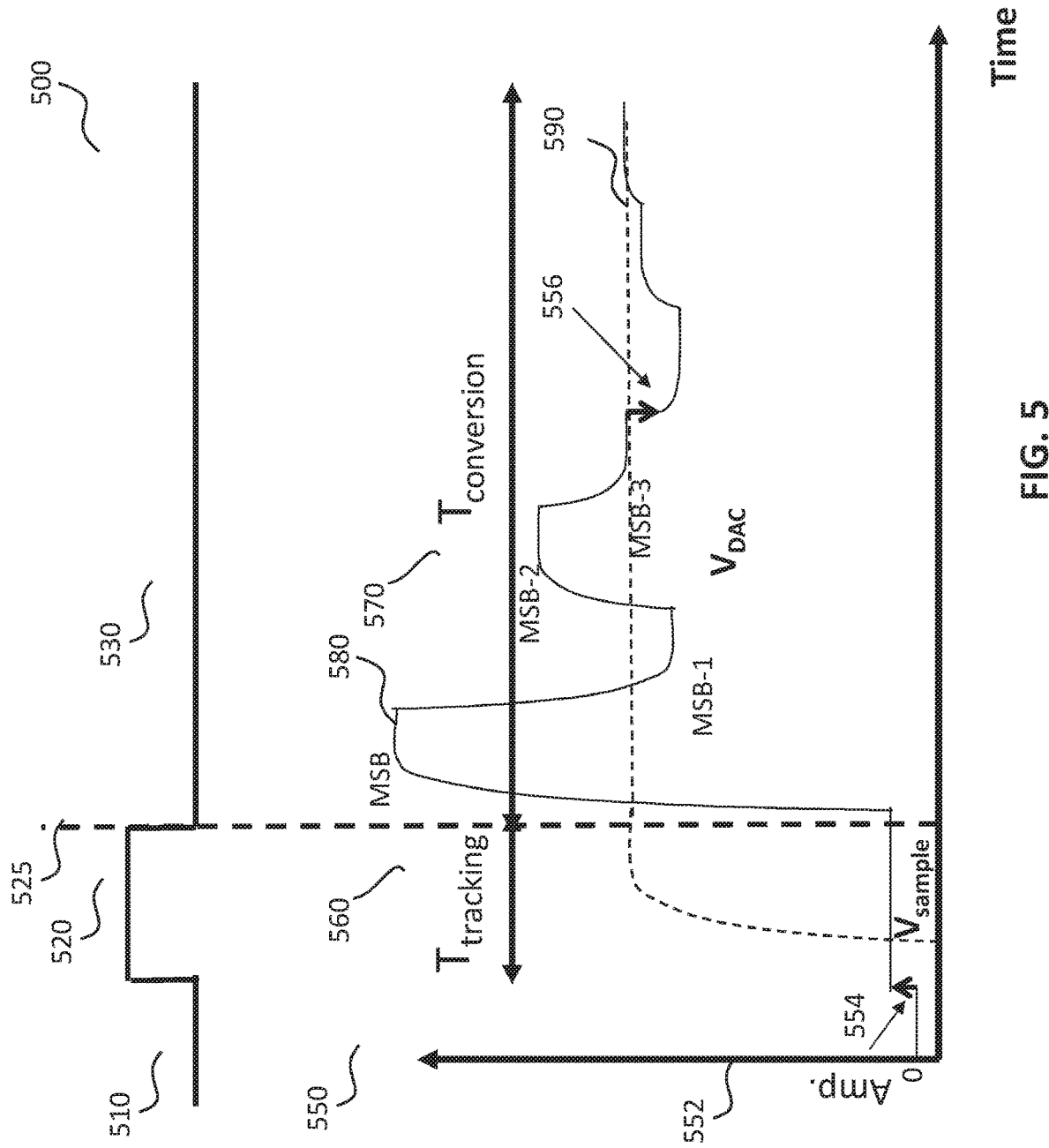
FIG. 5 illustrates DAC output during conversion step of the proposed SAR ADC, according to example embodiments of the invention

Referring now to FIG. 5 an example timing diagram 500 of an improved SAR ADC with the DAC output during a conversion phase is illustrated, according to example embodiments of the invention. The example timing diagram 500 includes a sampling clock 510 that illustrates the timing of the sampling phase 520 and the switch to a conversion phase 530 at a clock edge 525.

The operation of an SAR ADC, such as SAR ADC 400 of FIG. 4, consists of two phases as shown in 550, which are repetitive when the ADC is active. At the end of a tracking phase 560, the analog input signal is sampled and held by a T/H circuit, such as T/H circuit 414 in FIG. 4. In a second SAR conversion phase 570, the SAR controller controls the DAC in a way that the voltage difference between its output 580 ($V_{DAC}$) and the sampled input signal 590 decreases in each conversion period. During each conversion period, the sign of the amplitude 552 difference between the sampled signal ($V_{sample}$) 590 and the DAC output signal ($V_{DAC}$) 580 is determined by a comparator. At the end of the conversion phase, the DAC output signal ($V_{DAC}$) 580 approximates the sampled signal ($V_{sample}$) 590, with a maximum deviation of $V_{LSB}/2$. The output digital codes ($D_{out}$) represent the sampled analog signal.

In accordance with examples of the invention, the dither circuit adds a dither signal (e.g. a random number) to the feedback signal at an input of the DAC at 554 during a sampling phase. The conversion phase then starts at 525 and continues through a number of MSB DAC cell outputs until, at 556 and notably during the conversion phase, the dither signal is switched to be subtracted from the feedback signal at an input of the DAC. In this manner, unwanted harmonic distortion and spurs are reduced or removed, and, consequently, the linearity of the SAR ADC is improved.

Figure 6:
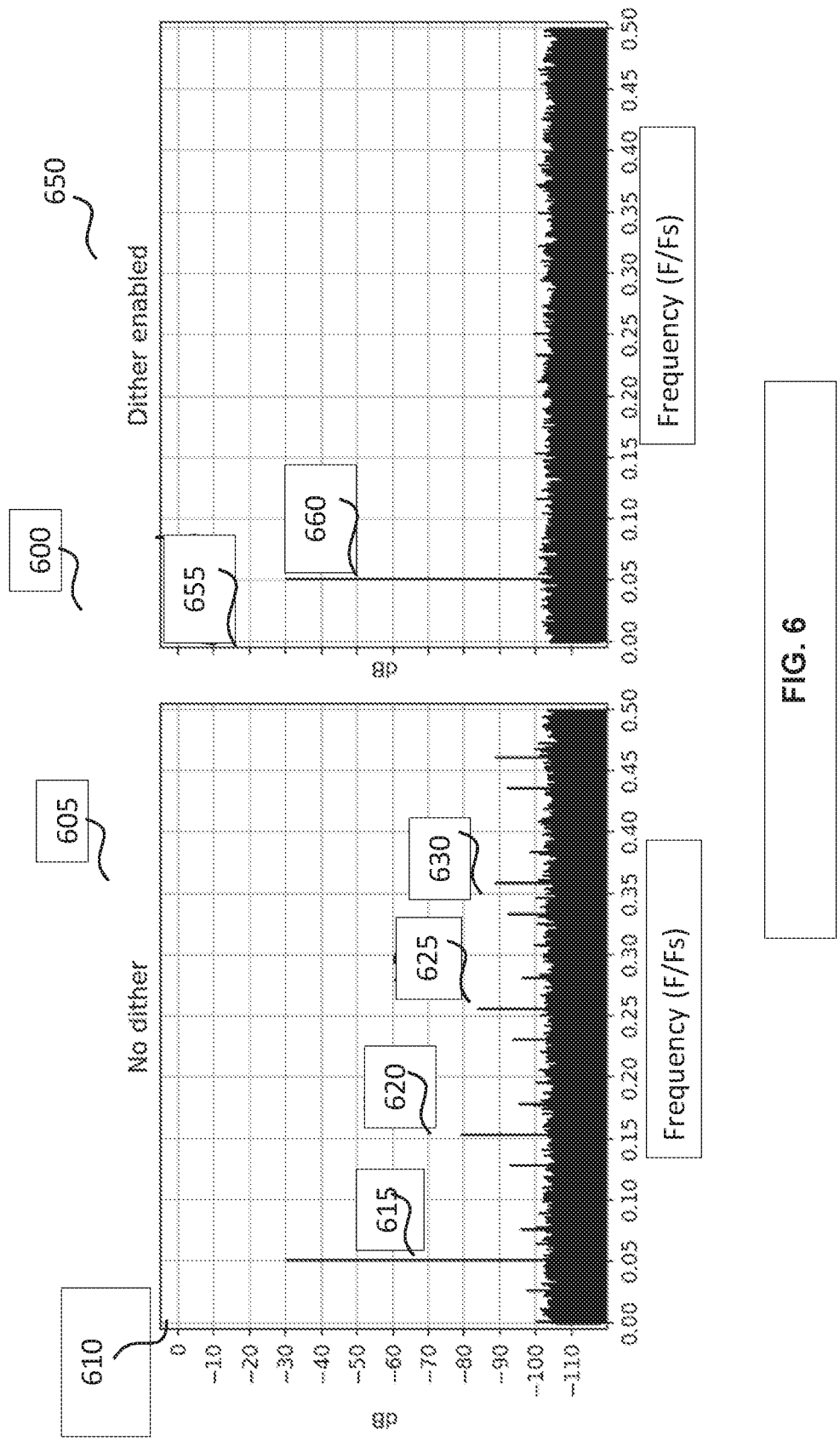
FIG. 6 illustrates a graphical representation of a linearity improvement for the SAR ADC, according to example embodiments of the invention.

Referring now to FIG. 6, a graphical representation 600 of a linearity improvement for the SAR ADC is illustrated, according to example embodiments of the invention. A first graphical representation 605 illustrates a linearity performance of a SAR ADC without a dither signal, whereas a second graphical representation 650 illustrates a linearity performance of a SAR ADC with a dither signal that is generated and implemented in accordance with example embodiments of the present invention. The first graphical representation 605 of a SAR ADC without a dither signal shows high levels of the third harmonic distortion content 615, fifth harmonic distortion content 620, seventh harmonic distortion content 625 and ninth harmonic distortion content 630, for an input signal 610. In contrast, the second graphical representation 650 illustrates a linearity performance of a SAR ADC with a dither signal that is generated and implemented in accordance with example embodiments of the present invention that is comparable with the no-dither example for the third harmonic distortion content 660, with the higher harmonic distortion content reduced to the level of the noise floor.

Figure 7:
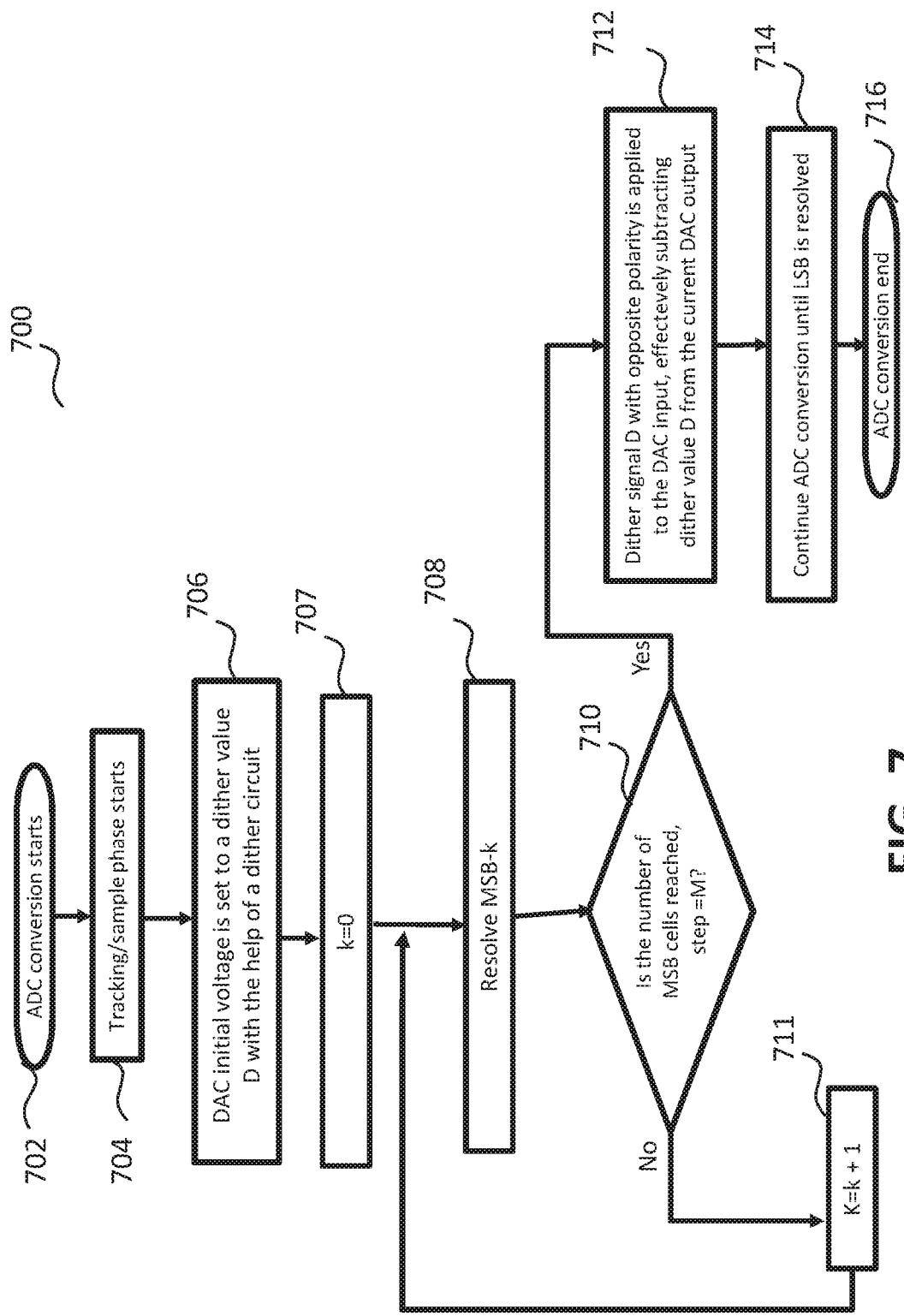
FIG. 7 illustrates an example flowchart of an improved SAR ADC, according to example embodiments of the invention.

Referring now to FIG. 7, an example flowchart 700 of an improved SAR ADC is illustrated, according to example embodiments of the invention. The example flowchart 700 of the SAR ADC starts at 702 with an ADC conversion, and a tracking/sample phase starts at 704. At the end of the tracking phase, an analog input signal is sampled by a track and hold circuit (T/H). In accordance with examples of the invention, at the same time and at 706, a DAC initial voltage is set, effectively adding a dither value 'D' to a feedback signal with the help of a dither circuit, such as dithering circuit 468 in FIG. 4. In this manner, the dither circuit generates a random number and introduces (i.e. adds) it to the DAC input 442 in the SAR ADC feedback path of FIG. 4. At 707, a bit counter 'k' is set to '0'. At 708, successive approximation conversion phase starts, operating from step one to step 'M', and resolving up to MSB-k bits. At 710, a determination is made as to whether the number of MSB cells that have been resolved has reached 'M'. If the number of MSB cells that have been resolved has not reached 'M' at 710, then the value of the bit counter k is incremented and the process loops to 708 and the next MSB is resolved. When the desired number of MSB resolved cells has been reached, in 710, the dithering circuit then applies the dither value 'D' with opposite polarity to the DAC input, effectively subtracting the dither value 'D' from the current DAC output, at 712. At 714, the ADC conversion is continued with until the least significant bit (LSB) is resolved, and once the LSB has been resolved the ADC conversion ends at 716.

The known art proposes to subtract dither after the conversion phase is finished, in the digital domain. The approach described herein adds a little extra overhead in digital domain, but proposes to subtract a dither value during the conversion phase. Moreover, since the dither circuit/component is basically a DAC, any difference between the analog output of the DAC and its' digital representation adds extra noise after subtraction, thereby degrading the overall SNR performance of the ADC. In contrast, examples of invention propose that the subtraction is a built-in operation of the DAC that does not require any 'knowledge' about a dither DAC in the digital domain and does not require any post-processing in digital domain.

Thus, examples of the invention describe a SAR ADC that includes a track and hold circuit configured to sample an analog input signal; a comparator coupled to the track and hold circuit and configured to compare the sampled analog input signal with a DAC output voltage; and a feedback path that comprises a DAC and configured to generate the voltage that approximates the input analog signal. As would be appreciated, the DAC output is a voltage that is fraction of a reference voltage +/−DAC voltage after the previous bit has been resolved. The SAR ADC further includes a dither circuit coupled to or located in the feedback path and arranged to add a dither signal at the input of the DAC in a first time period (e.g. a sampling phase) and subtract the dither signal from the output digital signal routed via the feedback path and input of the DAC in a second time period during a conversion phase of the SAR ADC.

Moreover, it is possible to implement this approach requiring no extra circuitry in analog domain. Thus, examples of the invention propose that the subtraction of the added dither happens not in a digital domain, when a final ADC word is available, but before that in the analog domain, during the conversion process. In this context, it is considered the analog domain in spite of the fact that digital code is added to the DAC input, as the subtraction of the dither happens at the DAC output (which is analog) when its input is switched and before the final ADC output code is available.

In some examples of the invention, the use of a programmable number of MSB DAC cell outputs to convert an input analog signal before the dither signal is subtracted from the fed back signal, enables the SAR ADC to employ an adaptive conversion scheme. In this manner, the SAR ADC may be configured, or reconfigured, say 'on the fly', to be insensitive to mismatches of MSB DAC cells. Alternatively, in some examples, the number of MSB DAC cells employed before the dither signal is subtracted from the fed back signal may be a predefined value.

Although examples of the invention are described with reference to a radar unit for, say, an automotive safety system, it is envisaged that the concepts herein described may be applicable to any application where a linearity for small signals is desirable.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above. The connections as discussed herein may be any type of connection suitable to transfer signals from or to the respective nodes, units or integrated circuit devices. Accordingly, unless implied or stated otherwise, the connections may for example be direct connections or indirect connections. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the architectures depicted herein are merely exemplary, and that in fact many other architectures can be implemented which achieve the same functionality. Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the circuit and/or component examples may be implemented as any number of separate integrated circuits or separate devices interconnected with each other in a suitable manner. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one, or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A successive approximation register, SAR, analog-to-digital converter, ADC, comprises:
    a track and hold circuit configured to sample an analog input signal;
    a comparator coupled to the track and hold circuit and configured to compare the sampled analog input signal with a DAC output voltage; and
    a feedback path that comprises a digital-to-analog converter, DAC, configured to generate the reference voltage that approximates the input analog signal;
    a dither circuit coupled to the feedback path and arranged to add a dither signal at the input of the DAC in a first time period and subtract the dither signal from the output digital signal routed via the feedback path and an input of the DAC in a second time period during a conversion phase of the SAR ADC.

2. The SAR ADC of claim 1 wherein the addition of the dither signal occurs during a tracking phase of the SAR ADC.

3. The SAR ADC of claim 1 wherein the dither circuit is located in the feedback path.

4. The SAR ADC of claim 1 wherein the DAC comprises a number of DAC cells and wherein a SAR controller coupled to an output of the comparator configures the dither circuit to subtract the dither signal from the output digital signal in the second time period after a number (N) of most significant ADC bits have been resolved.

5. The SAR ADC of claim 4 wherein the number (N) of most significant DAC cells is less than a total number of DAC cells to be resolved.

6. The SAR ADC of claim 5 wherein the dither circuit is arranged to successively resolve a preset or programmable number of most significant bit, MSB, values of the sampled analog input signal (414).

7. The SAR ADC of claim 1, wherein the subtraction of the dither occurs in an analog domain at an output of the DAC before a final ADC output code is available.

8. The SAR ADC of claim 1, wherein the dither circuit applies the dither signal with opposite polarity to an input of the DAC input, thereby subtracting a previously added dither value, D, from a present DAC output.

9. The SAR ADC of claim 1, wherein the dither circuit comprises a random number generator coupled to a summing junction located in the feedback path and configured to add and subsequently subtract a random number value generated as the dither signal to the input of the DAC.

10. The SAR ADC of claim 9 wherein the random number generator generates a positive representation of the dither signal when adding the dither signal to the output digital signal in the summing junction and a negative representation of the dither signal when subtracting the dither signal from the output digital signal in the summing junction.

11. The SAR ADC of claim 1, wherein the DAC is one from a group of: a current steering, charge redistribution or resistive DAC.

12. A radar unit comprising at least one antenna coupled to at least one radio frequency circuit configured to receive and down-convert received radar signals, wherein the radar unit comprises a baseband circuit having a successive approximation register, SAR, analog-to-digital converter, ADC, arranged to receive a down-converted baseband received radar signal and convert the down-converted baseband received radar signal to a digital form, wherein the SAR ADC comprises:
    a track and hold circuit configured to sample an analog input signal;
    a comparator coupled to the track and hold circuit and configured to compare the sampled analog input signal with a reference voltage; and
    a feedback path that comprises a digital to analog converter, DAC, configured to generate the reference voltage that approximates the input analog signal, such that the comparator determines a sign of a subtraction operation between the sampled input and DAC output;
    a dither circuit coupled to the feedback path and arranged to add a dither signal at the input of the DAC in a first time period and subtract the dither signal from the output digital signal routed via the feedback path and input of the DAC in a second time period during a conversion phase of the SAR ADC.

13. A method for digitizing a received analog input signal in a successive approximation register, SAR, analog-to-digital converter, ADC, wherein the method comprises:
    sampling an analog input signal by a track and hold circuit;
    comparing the sampled analog input signal (414) with a DAC output voltage by a comparator; and
    generating, by a digital to analog converter, DAC, the voltage that approximates the input analog signal;
    adding a dither signal at an input of the DAC in a first time period and
    subtracting the dither signal from the output digital signal routed via a feedback path and input of the DAC in a second time period during a conversion phase of the SAR ADC.

14. The method of claim 13 wherein adding the dither signal at an input of the DAC in a first time period comprises adding during a tracking phase of the SAR ADC.

15. The method of claim 13 wherein the DAC comprises a number of DAC cells and subtracting the dither signal comprises subtracting the dither signal from the output digital signal in the second time period after a number (N) of most significant DAC cells have been resolved.

16. The method of claim 15, wherein the number (N) of most significant DAC cells is less than a total number of DAC cells to be resolved.

17. The method of claim 16, further comprising successively resolving a preset or programmable number of most significant bit, MSB, values of the sampled analog input signal.

18. The method of claim 13, wherein subtracting the dither occurs in an analog domain at an output of the DAC before a final SAR ADC output code is available.

19. The method of claim 13, further comprising applying the dither signal with opposite polarity to an input of the DAC input, thereby subtracting a previously added dither value, D, from a present DAC output.

20. The method of claim 13, further comprising adding and subsequently subtracting a random number value generated as the dither signal to the input of the DAC by a random number generator coupled to a summing junction located in the feedback path.

* * * * *